United States Patent [19] [11] 3,737,282
Hearn et al. [45] June 5, 1973

[54] METHOD FOR REDUCING CRYSTALLOGRAPHIC DEFECTS IN SEMICONDUCTOR STRUCTURES

[75] Inventors: Eric W. Hearn, Wappingers Falls; Guenter H. Schwuttke, Poughkeepsie; Erich H. Tekaat, Fishkill, all of N.Y.

[73] Assignee: International Business Machines Corporation, Armonk, N.Y.

[22] Filed: Oct. 1, 1971

[21] Appl. No.: 185,652

[52] U.S. Cl. ..........................432/6, 148/1.5, 432/11, 432/253
[51] Int. Cl. ..........................F27b 21/00, F27b 17/00
[58] Field of Search ........................263/41, 47 R, 52; 148/1.5

[56] References Cited

UNITED STATES PATENTS

| | | | |
|---|---|---|---|
| 3,644,154 | 2/1972 | Hoogendoorn et al. | 148/1.5 |
| 3,669,431 | 6/1972 | Lenss et al. | 263/47 R |
| 3,183,130 | 5/1965 | Reynolds et al. | 263/47 R |

*Primary Examiner*—John J. Camby
*Attorney*—Daniel E. Igo, Alvin J. Riddles and J. Jancin, Jr.

[57] ABSTRACT

A method for fabricating semiconductor structures, wafer and devices with reduced thermally induced crystallographic defects comprising (a) supporting said wafers in close proximity to one another, (b) heating said wafers to an elevated temperature, (c) maintaining a uniform circumferential heat mass surrounding said wafers, (d) immediately withdrawing said material from the heating zone, and (e) symmetrically cooling said wafers.

7 Claims, 6 Drawing Figures

INVENTORS
ERIC W. HEARN
GUENTER H. SCHWUTTKE
ERICH H. TE KAAT

BY [signature]
ATTORNEY

METHOD FOR REDUCING CRYSTALLOGRAPHIC DEFECTS IN SEMICONDUCTOR STRUCTURES

FIELD OF THE INVENTION

The present invention relates to an improved method for heating semiconductor structures or wafers during oxidation, diffusion, drive-in, and similar thermal processing procedures and the cooling thereof with minimum thermal induced crystallographic defects.

DESCRIPTION OF THE PRIOR ART

The miniaturization of semiconductor structure devices and integrated circuits aims to achieve lower fabrication costs, greater component density, and increased component reliability. The planar fabrication technique is most commonly used and involves a series of successive formations of insulating masks on the surface of a semiconductor wafer and diffusions of conductivity determining impurities through said masks. The wafer is then cut into chips containing either discrete devices or integrated circuits. The trend has been in the direction of smaller discrete devices or circuit elements on larger chips containing integrated circuits having increasing numbers of devices. Further, in order to lower production cost and to efficiently accommodate larger chips, the diameter of wafers being used has been increasing. It is common practice to employ wafers having diameters of 2¼ inches and greater, as compared to the wafer size previously used in the magnitude of one inch to 1½ inch diameter.

With the increasing density of circuit elements and devices per wafer, the problem of crystallographic defects such as strain induced dislocations during processing has become increasingly significant. The problem of crystallographic defects has been recognized in the past and is well known. G. H. Schwuttke, *Air Force Cambridge Research Laboratory*, AFCRL–70–0110, March 1970. These defects appear to be primarily dislocations in the crystal structure caused by strains resulting from the cooling of the wafer and mechanical handling of the wafer during the process. When the chips to be formed from the wafer contain either discrete devices or integrated circuit elements, it is essential that the dislocation problem be eliminated or controlled in order to maximize the use or yield of wafer surface and bulk area. Dislocations in certain areas of the wafers render chips formed from these areas inoperative which results in the loss of yield. Likewise, with integrated circuits of increasing device density on wafers to be divided into individual chips having hundreds of components, the dislocation problem becomes even more significant and whenever a crystallographic defect renders a chip inoperative a complex integrated circuit with hundreds of elements would thereby be rendered inoperative. It is also known that in wafers having increasing diameters, the crystallographic defects and thermal warpage become more pronounced and greater in quantity. It has been recognized that the primary cause of crystallographic defects such as dislocations in wafers is the application of high temperature in excess of 1000°C or higher during the surface oxidation steps and the diffusion steps of conventional planar semiconductor structure fabrication and the cooling thereof. During such diffusion and oxidation steps, it is conventional practice to mount the wafers in a holder in which the wafers will stand upright supported at their lower level spaced from one another in a file or row.

The wafer holder is made of refractory material such as quartz. The holder containing the wafers is placed in a conventional reaction housing, for example, a closed tube or open tube and the entire housing is inserted into a furnace or oven.

It has been known that wafers mounted in this conventional manner do not maintain a constant temperature distribution across the surface of the wafer during exposure to high temperature and particularly during the cooling of the wafers which have been heated to a temperature in excess of 1000°C. Instead, temperature gradients arise across the surface of the wafer. For example, during the cooling, the portions of the wafer contacting the holder appear to cool more slowly than other portions of the wafer and the center of the wafer also appears to cool at a slower rate than the exposed end portions or the periphery of the wafer. The irregular expansions and contractions in varying portions of the wafer caused by the irregular temperature gradient results in stresses which in turn cause the crystallographic defects and warpage. Crystallographic defects and warpage have been substantially eliminated during such high temperature oxidation and diffusion steps by maintaining the wafer during such processing in a position wherein at least one entire surface of the wafer is less than one quarter of an inch from a member having a heat capacity of at least ten times that of the wafer. The heat capacity in that particular instance is defined as the mass of the member multiplied by the amount of heat necessary to raise one gram of the substrate material one degree. The member in this teaching acts to provide a constant temperature distribution across the surface of the wafer, particularly during cooling and thereby eliminating thermal stresses which cause the crystallographic defects and warpage.

It is current practice in processing semiconductor structures and devices through oxidation, diffusion and similar process steps to follow the slow cooling technique which merely entails manually or mechanically slowly withdrawing a container of wafers from a furnace or elevated temperature zone to an atmosphere at room temperature. Various withdrawal rates, either constant or variable, have been used successfully in an attempt to eliminate crystallographic defects or dislocations.

SUMMARY OF THE INVENTION

Accordingly, it is a principle object of the present invention to provide a method for processing semiconductor structures in which thermally introduced crystallographic defects are minimized.

It is a further object of this invention to provide a method for processing semiconductor structures whereby warpage caused by thermally induced stresses is minimized.

It is still a further object of this invention to provide a method for processing semiconductor wafers, structures and devices at elevated temperatures and symmetrically cooling the structures following high temperature processing.

It is still a further object of this invention to provide a method and apparatus whereby thermal stress gradients resulting from heating and cooling semiconductor wafers are minimized.

It is still a further object of this invention to provide a method whereby upon the completion of an elevated temperature processing step, the semiconductor structure can be immediately withdrawn from the heating zone and allowed to symmetrically cool to ambient temperature.

We have found that the primary cause of crystallographic defects such as dislocations in wafers is caused by the thermal gradient across the wafer during the currently known cooling methods and processing, and have provided a method for the high temperature processing of semiconductor structures which comprises heating the structure to an elevated temperature for a desired time followed by immediate withdrawal from the furnace or heating means and symmetrically and uniformly cooling the structures while maintaining a circumferential heat mass about the structure during the cooling period.

The foregoing and other objects, features and advantages of the invention will be apparent from the following more particular description of preferred embodiments of the invention as illustrated in the accompanying drawings.

DESCRIPTION OF THE PREFERRED EMBODIMENTS

The concept of this invention is more vividly illustrated and explained by a description and comparison of actual thermal processing tests performed using silicon semiconductor wafers. It is recognized that crystallographic dislocations and warpage result from thermal gradients induced by the cooling techniques used currently during high temperature processing of semiconductor structures. The utilization of open containers, racks, and the like, as apparatus to support the semiconductor structures in a furnace requires slow manual or mechanical withdrawal in an attempt to uniformly slowly cool the wafer. Notwithstanding these efforts under the said conditions, the periphery or outer edge segment cools more rapidly than the center section. This condition establishes thermally induced compressive and other stresses which cause crystallographic dislocations, warpage and other defects.

Figure 1:
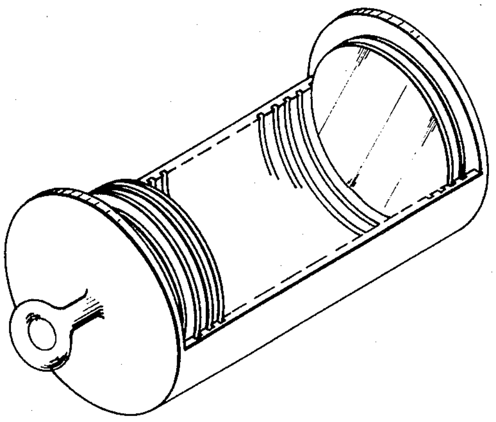
FIG. 1 is a perspective view of a conventional open type cylindrical container containing silicon semiconductor wafers.
Figure 5:
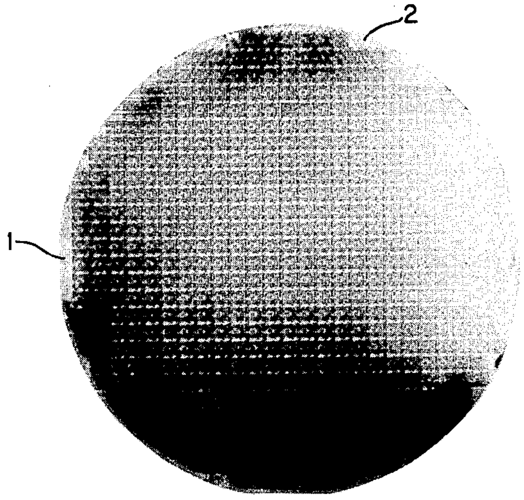
FIG. 5 is a photomicrograph of a Scanning Oscillator Technique (SOT) topograph of a silicon wafer having device patterns upon the surface and which has been heated to 1150°C for two hours and slowly cooled by withdrawing from the furnace at the rate of three inches per minute, cooling at a rate of 130°per minute.

FIG. 1 illustrates a conventional type container used to heat a multiplicity of silicon wafers to an elevated temperature in an oxidizing atmosphere. Silicon wafers are secured radially in separate slots and normally heated up to 1150°C for various and specific times and slowly withdrawn from the furnace at a rate of between one inch and four inches per minute. Translated to cooling rate, this amounts to a cooling rate of approximately 130° per minute. FIG. 5 is a photomicrograph of a Scanning Oscillator Technique (SOT) topograph. This procedure was developed by G. H. Schwuttke and is reported in *The Journal of Applied Physics*, Vol. 36, No. 9, pp.2712–2721, September 1965. This topograph shows peripheral crystallographic dislocations at illustrative locations 1 and 2 and at other obvious areas of the wafer. The semiconductor devices constructed upon wafer areas having dislocations are defective and not suitable for further device processing and ultimate component utility.

Figure 3:
FIG. 3 is a composite photomicrograph of a Scanning Oscillator Technique (SOT) topograph of a silicon wafer heated to a temperature of 1200°C in an apparatus illustrated in FIG. 1 and rapidly cooled by immediately removing the apparatus from the furnace.

FIG. 3 is a composite photomicrograph by SOT topograph procedure referred to above of a silicon wafer heated to a temperature of 1200°C for one hour in a conventional container and immediately withdrawn from the furnace to room temperature and allowed to cool. The wafer warpage or deviation from flat was so extreme as to require composite topography in order to make an appropriate overall photograph. The crystallographic imperfections and dislocations are so pronounced as to make semiconductor wafers processed in accordance with this procedure almost useless.

Therefore, for many years, semiconductor wafers processed at elevated temperatures in oxidation, diffusion, drivein and other process steps have been slowly manually or mechanically withdrawn from the furnace in an obvious attempt to minimize crystallographic imperfections or dislocations and warpage.

It is known that during the current cooling techniques for normal stack configuration silicon semiconductor wafers processed at elevated temperatures the structures are subject to high compressive stresses which cause the generation of crystalline defects and the undesirable condition called thermal warping. These effects are due to high temperature gradients between the center of a wafer or structure and the circumferential periphery. The amount of this temperature difference has been calculated for various stacked wafer configurations without consideration of container apparatus influence, S. M. Hu, *Journal of Applied Physics*, Temperature Distribution and Stresses in Circular Wafers in a Row During Radiative Cooling, Vol. 40, No. 11, pp.4413–4423, October 1969, except to say the container or wafer support mechanism acts as a heat sink and tends to increase the thermal gradient described above. K. Morizane and P. S. Gleim, *Journal of Applied Physics*, Thermal Stress and Plastic Deformation of Thin Silicon Slices, Vol. 40, pp.4104, 1969. This effect is true only for non-symmetric configurations.

Figure 2:
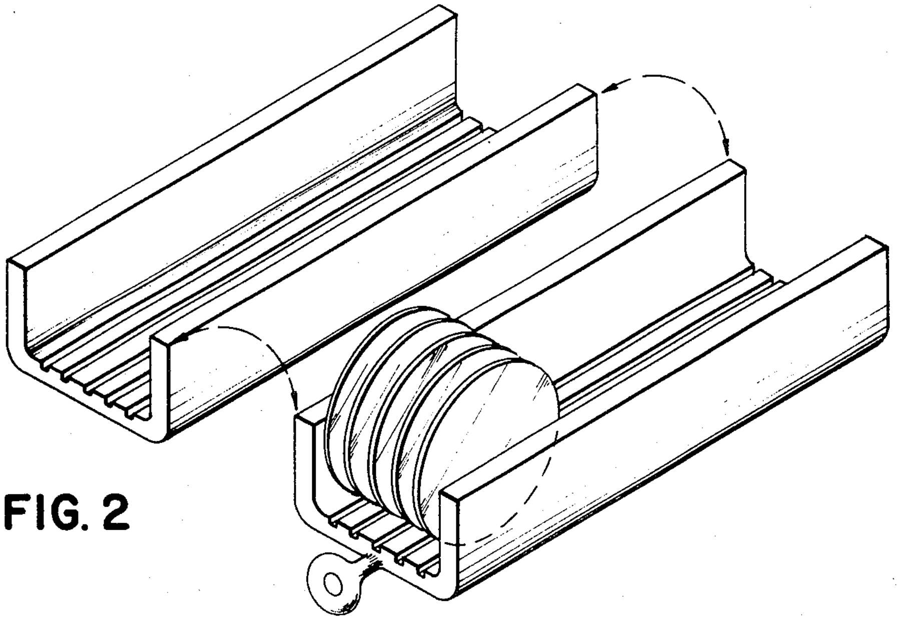
FIG. 2 is a perspective view of an illustrative apparatus suitable for use in practicing this invention.
Figure 2A:
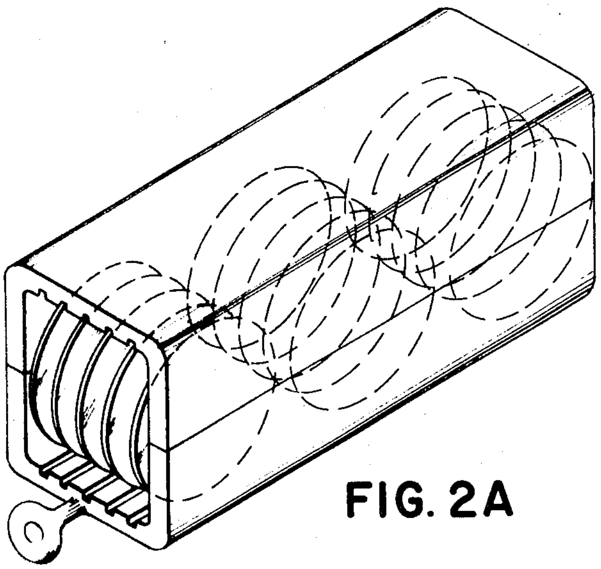
FIG. 2A is a perspective view of the apparatus illustrated in FIG. 2 having the top section mounted upon and closing the base or lower section.
Figure 4:
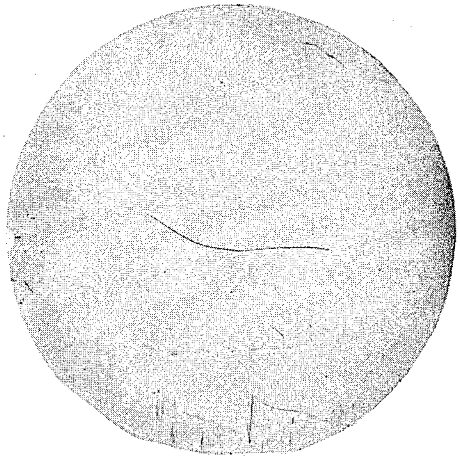
FIG. 4 is a photomicrograph of a Scanning Oscillator Technique (SOT) topograph of a silicon wafer heated to a temperature of 1200°C in an apparatus shown in FIG. 2 and FIG. 2A and immediately removed from the furnace to cool to ambient temperature in accordance with this invention.

When 2¼ inch polished silicon semiconductor wafers were heated to 1200°C for one hour in an apparatus shown in FIG. 1 and in an apparatus shown in FIGS. 2 and 2A and immediately withdrawn from the furnace elevated temperature area to room temperature and allowed to cool, the resultant crystallographic condition is represented by the photomicrograph of FIG. 3 when apparatus illustrated in FIG. 1 was utilized and a crystal structure illustrated in FIG. 4 resulted in utilizing apparatus of the type illustrated in FIGS. 2 and 2A.

The warpage which occurred utilizing apparatus of FIG. 1 was determined by measuring the elevation of the wafer from an optical flat with a loupe of resolution 2 to 4 mils. The average warpage was about 30 mils, while no measurable warpage occurred utilizing the apparatus depicted in FIGS. 2 and 2A.

The foregoing comparisons are significant to explain and illustrate the method steps of this invention which comprise the steps of heating semiconductor structures to an elevated temperature which in most processing steps ranges between 300° and 1200°C and holding structures within this temperature range for a specific period of time usually a few minutes to a few hours, followed by immediately removing the material from said high temperature into room temperature and symmetrically cooling the structure to the desired lower or room temperature.

During the cooling period, the maximum dislocation density and warpage is directly proportional to the temperature gradient between the center of a cooling semiconductor wafer and its peripheral edge. This T gradient can be as high as 190° to 200°C.

The wafer mass or semiconductor structure container mass represents the significant system mass in addition to the semiconductor material per se in the heating and cooling system. This container undergoes the same heat treatment as the semiconductor wafers and affects the cooling cycle in that it absorbs and emits heat as a radiator, reflects heat as a reflector and conducts heat at the contact point between container and wafer. The contacting points are usually single isolated points about the periphery of the wafer. It has been measured that heat conduction at these points contributes to additional thermal gradients. Therefore, it is desirable to maintain wafer-container contact points at a minimum respecting the contacting or touching area.

The radiation and reflection of the wafer container apparatus, often referred to as a boat, is a principle factor in lowering and eliminating thermal gradients in the semiconductor wafer structures provided the container mass affords a symmetrically distributed heat mass around the wafers which in turn allows the cooling or heat loss from the wafer to take place symmetrically. A container apparatus having better reflective properties than the quartz containers will facilitate symmetrical cooling in accordance with this invention.

The mass of the tubular container apparatus is inversely proportional, and the mass of the wafer is directly proportional to thermal gradients across the wafers. Therefore, the quotient of both masses i.e., (mass of wafer stack)/ (mass of the tubular container) relates to the elimination or reduction of crystallographic defects and warpage. In general, a decrease of this quotient enables symmetrical cooling because in that instance the symmetrical tubular container mass is the determining parameter in the cooling phase.

The materials of construction for container or support apparatus for semiconductor wafers, structures and other pieces is preferably fused silica or quartz. Nevertheless, any refractory material which can tolerate the elevated process temperature and does not react with the material being heat treated or processed may be used if it is capable of being formed into a suitable shape to allow the formation of symmetrical circumferential heat mass.

Although the illustrative container shape in FIGS. 2 and 2A are applicable, the practical shape as shown in FIG. 1 is also applicable provided the container walls surround the semiconductor wafers completely and are of sufficient thickness or mass to provide symmetrical cooling or heat dissipation from the wafers during the cooling phase. The condition is illustrated by the example where a semicylindrical fused silica container as illustrated in FIG. 1 was utilized to heat silicon semiconductor wafers to a temperature of 1000°C for one hour and immediately removed from the heating zone and allowed to cool. This produced a measured maximum ΔT temperature gradient across the wafer of 190°–200°C which resulted in major dislocation densities as shown in FIG. 3 and approaching maximum warpage in the magnitude of 30 mils or greater for 2¼ inch diameter wafers.

A similar fused silica container made cylindrical with open ends and having ⅛ inch wall thickness was used in a comparative measurement and resulted in a thermal gradient ΔT of only 70°C and at least a decrease of 50 percent in crystallographic defect density and warpage was reduced to 10 mils.

Finally, a similar procedure duplicating temperature and time condition was repeated in a container illustrated in FIGS. 2 and 2A made of fused silica having wall thickness of ¼ inch produced heat treated silicon semiconductor wafers having zero warpage and zero ΔT temperature gradient during the cooling phase which produce about zero crystallographic imperfections. Measurements were in accordance with the SOT topograph method described above.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A method for elevated temperature processing of semiconductor structures comprising:

a. supporting semiconductor structures in a tubular member,
b. heating said tubular member containing semiconductor structures for a period of time,
c. immediately withdrawing said member containing semiconductor structures from the heating zone, and
d. symmetrically cooling said semiconductor structures in said tubular member to ambient temperature.

2. A method in accordance with claim 1 wherein said tubular member ends are open.

3. A method in accordance with claim 2 wherein said tubular member ends are closed.

4. A method in accordance with claim 1 wherein said semiconductor structures are silicon wafers.

5. A method in accordance with claim 1 wherein said tubular member is fused silica.

6. A method in accordance with claim 1 wherein said semiconductor structures are heated to a temperature between 300° and 1500°C.

7. A method in accordance with claim 1 wherein said semiconductor structures are heated at a temperature between 350° and 1500°C.

* * * * *